United States Patent
Hook et al.

(10) Patent No.: US 6,278,102 B1
(45) Date of Patent: Aug. 21, 2001

(54) METHOD OF DETECTING ELECTROMAGNETIC RADIATION WITH BANDGAP ENGINEERED ACTIVE PIXEL CELL DESIGN

(75) Inventors: Terence B. Hook, Jericho Center; Jeffrey B. Johnson, Essex Juction; Robert Leidy, Burlington, all of VT (US); Hon-Sum P. Wong, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/415,642

(22) Filed: Oct. 12, 1999

(51) Int. Cl.[7] .................................................... H01L 27/00
(52) U.S. Cl. ...................................... 250/208.1; 250/214.1
(58) Field of Search .............................. 250/208.1, 214.1, 250/207, 305–307; 257/291, 431; 313/103 R

(56) References Cited

U.S. PATENT DOCUMENTS

| 4,654,536 | 3/1987 | Saito et al. . |
|---|---|---|
| 4,691,242 | 9/1987 | Kato et al. . |
| 4,728,997 | 3/1988 | Szydlo et al. . |
| 4,736,234 | 4/1988 | Boulitrop et al. . |
| 4,740,824 | 4/1988 | Yano et al. . |
| 4,772,924 | 9/1988 | Bean et al. . |
| 5,004,903 | 4/1991 | Kitamura et al. . |
| 5,070,380 | 12/1991 | Erhardt et al. . |
| 5,093,564 | 3/1992 | Miyagaki et al. . |
| 5,129,040 | 7/1992 | Hanazato et al. . |
| 5,256,550 | 10/1993 | Laderman et al. . |
| 5,315,102 | 5/1994 | Abe et al. . |
| 5,351,309 | 9/1994 | Lee et al. . |
| 5,432,374 | 7/1995 | Norton . |
| 5,481,124 | 1/1996 | Kozuka et al. . |
| 5,675,158 | 10/1997 | Lee . |
| 5,712,497 | 1/1998 | Watanabe et al. . |
| 6,121,869 | * 9/2000 | Burgess ................................ 338/99 |

FOREIGN PATENT DOCUMENTS

| 56-108284 | 8/1981 | (JP) . |
|---|---|---|
| 60-65565 | 4/1985 | (JP) . |
| 60-214172 | 10/1985 | (JP) . |
| 63-1222285 | 5/1988 | (JP) . |
| 1-227470 | 9/1989 | (JP) . |
| 2-218162 | 8/1990 | (JP) . |
| 08335688 A | 12/1996 | (JP) . |

* cited by examiner

Primary Examiner—Que T. Le
(74) Attorney, Agent, or Firm—DeLio & Peterson, LLC; Peter W. Peterson; Eugene I. Shkurko

(57) ABSTRACT

A method of detecting electromagnetic radiation with an active pixel sensor photosensitive device having an extremely thin virtual pinning layer formed by inverting semiconductor material at the surface of a photosensitive region. The thin pinning layer improves blue light response. The inverted pinning layer is produced by connecting a negative potential source to a transparent conductive layer, preferably made of indium-tin-oxide positioned over most of the photosensitive region. The conductive layer is insulated from the photosensitive region by a thin insulating layer. Connection to the pinning layer is through a coupling region formed in an area not covered by the conductive and insulating layers. Red light response is improved and the depth of the photosensitive region reduced by creating a strained layer, preferably of germanium silicon, deep within the photosensitive region. The strained layer has a modified bandgap which increases the absorption rate of red light.

15 Claims, 2 Drawing Sheets

METHOD OF DETECTING ELECTROMAGNETIC RADIATION WITH BANDGAP ENGINEERED ACTIVE PIXEL CELL DESIGN

BACKGROUND OF THE INVENTION

1. Field of the Invention

This invention relates to solid state image sensors, and more particularly, to active pixel sensor (APS) technology.

2. Description of Related Art

Active pixel sensors, like charge coupled devices (CCD) are solid state photosensitive devices. Typically, the devices are organized into an array of photosensitive cells, with each cell in the array corresponding to a pixel. A typical application for CCD or APS image sensing arrays is in a digital camera, although there are many other known applications.

One advantage to APS devices over CCD devices is that APS technology is more compatible with metal oxide semiconductor (MOS) technology. This allows the support electronics needed to read signals from the APS array, and to process those signals, to be constructed on the same chip and at the same time as the APS array itself. This can significantly reduce the total cost of an APS technology based imaging device.

A basic prior art APS device comprises a reversed biased photosensitive region of semiconductor material that absorbs incident electromagnetic radiation and produces hole-electron pairs. The electrons generated by the incoming light are collected and held in the photosensitive region by the action of a pin diode formed between a pinning layer at the incident surface of the device and the semiconductor material in the photosensitive region.

Incoming electromagnetic radiation first passes through the pinning layer and then into the bulk of the semiconductor material forming the photosensitive region. Holes generated when the incoming electromagnetic radiation is absorbed are collected and removed from the photosensitive region by the pinning layer and the photodiode formed between the reverse-biased photosensitive region and the substrate. The pinning layer also serves to isolate the stored electrons from the semiconductor surface, which is known to provide significantly more sites for recombination than the silicon bulk.

Electrons, however, remain trapped in the photosensitive region until a transfer device removes them. The transfer device is typically a polysilicon gate and an adjacent semiconductor region. The polysilicon gate can be triggered by the application of a potential source to allow current flow between the photosensitive region and an adjacent semiconductor region. The number of electrons trapped in the photosensitive region relates to the intensity of the absorbed electromagnetic radiation and to the duration of exposure of the APS device to the incoming radiation.

Thus the current flow which occurs when the transfer device is activated determines the brightness at the pixel corresponding to the APS device. With multiple APS devices in an array, each one corresponding to a single pixel, a multiple pixel image can be built up by scanning the APS array and activating the transfer device for each cell to determine the brightness of the image at each pixel.

One problem with prior art APS designs relates to the fact that short wavelength radiation is easily absorbed in the pinning layer where there are many holes available. The bandgap energy of the semiconductor material in this layer is such that blue photons are efficiently absorbed. The electron-hole pairs created by this photon absorption will not contribute to the detected current flow when the transfer device is activated since the electrons created by the absorption in the pinning layer will quickly recombine with one of the many holes available. Thus, one goal in the construction of an APS cell is to minimize the depth of the pinning layer to decrease the number of blue photons absorbed in that layer.

A typical method of constructing the pinning layer is with ion implantation. After the ions are implanted, heat must be applied to activate this layer. However, this heat causes diffusion of the implanted ions generating a pinning layer which is thicker than desired. A pinning layer constructed in this way, while relatively shallow as compared to other layers in MOS devices, is still thick enough to absorb an undesirably high proportion of incoming short wavelength blue light.

The bandgap energy of semiconductor material in the pinning layer is comparable to the energy of photons in blue light resulting in efficient absorption of many of these photons even in a relatively shallow pinning layer. Because the absorbed photons do not reach the underlying photosensitive region, they cannot produce the necessary hole-electron pairs in that region. Thus, the blue sensitivity of a prior art APS device is reduced.

Yet another difficulty with prior art APS devices relates to the absorption of long wavelength radiation. Long wavelength red light photons have an energy less than the bandgap energy of the silicon pinning layer. Thus, they easily penetrate the pinning layer. However, for the same reason, absorption in the semiconductor material of the photosensitive region is also relatively poor. The photosensitive region of a prior art APS device needs to be quite thick in order to ensure that a high proportion of the incoming red light is absorbed in that region and will contribute to the detected current when the transfer device is activated.

The photosensitive region of a prior art APS cell is typically constructed in an epitaxially grown semiconductor layer. The thickness of this layer must be much greater than is needed for other MOS devices elsewhere on the substrate. It would be advantageous to reduce the thickness of this layer to simplify integration of the steps needed to construct the APS cell into standard MOS processes used in creating the associated support electronics. However, if this thickness is reduced, the depth of the photosensitive region is reduced with a corresponding reduction on the red light sensitivity of the APS device.

By way of example, a conventional APS cell may have a pinning layer having a thickness of 0.1 micrometers and an epitaxially grown p– layer of 5 to 8 micrometers.

Attempts to solve these problems have involved using stepped epitaxial thicknesses, or using dual parallel gate half cell designs in which each half cell is designed for red or blue absorption. However, each of these approaches is either expensive or is difficult to integrate into standard MOS production processes.

Bearing in mind the problems and deficiencies of the prior art, it is therefore an object of the present invention to provide a photosensitive device with improved blue and red light sensitivities. More specifically, it is an object of the present invention to improve blue light sensitivity by decreasing thickness of the pinning layer in an active pixel sensor and to improve red light absorption at shallower depths so that the thickness of the photosensitive region can be decreased.

Still other objects and advantages of the invention will in part be obvious and will in part be apparent from the specification.

SUMMARY OF THE INVENTION

The present invention comprises a method of detecting electromagnetic radiation with a photosensitive device in which blue light sensitivity is improved by dramatically decreasing the thickness of the pinning layer. This is accomplished by producing a "virtual" pinning layer through a local inversion of the surface of the photosensitive region. This inversion produces a very shallow pinning layer which can be as shallow as 0.01 micrometers in depth or less. With this extremely shallow pinning layer, blue light absorption is almost negligible.

To achieve a local inversion at the surface of the photosensitive region requires applying a potential between the surface and the underlying region. The preferred method of applying this potential is by providing a transparent insulating layer over at least a portion of the surface of the photosensitive region and a transparent conductive layer over the thin insulating layer. A potential source can then be applied to the transparent conductive layer to produce the surface inversion and form the pinning layer.

Improved performance of the APS device in red light absorption is achieved through the use of a strained layer having a reduced bandgap. The strained layer is positioned below the surface of the photosensitive region. Preferably, the strained layer is a silicon germanium strained layer. It may be formed by ion implantation or it may be grown epitaxially.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–4 of the drawings in which like numerals refer to like features of the invention.

Figure 1:
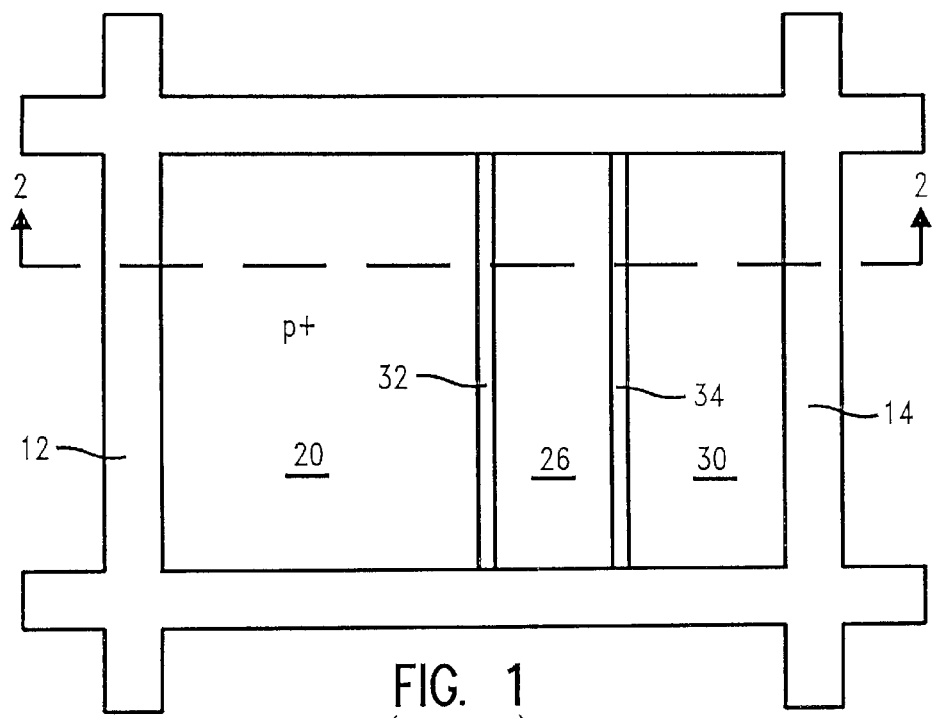
FIG. 1 provides a top plan view of an APS device constructed according to the prior art.
Figure 2:
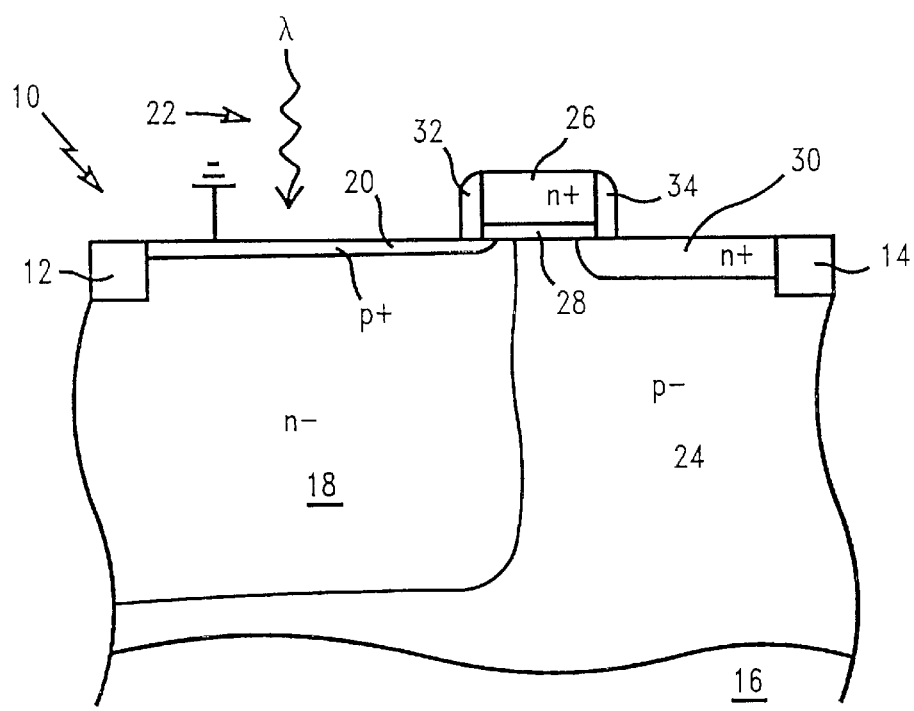
FIG. 2 provides a cross-sectional view of the prior art APS device of FIG. 1 taken along the line 2—2 in FIG. 1.
Figure 3:
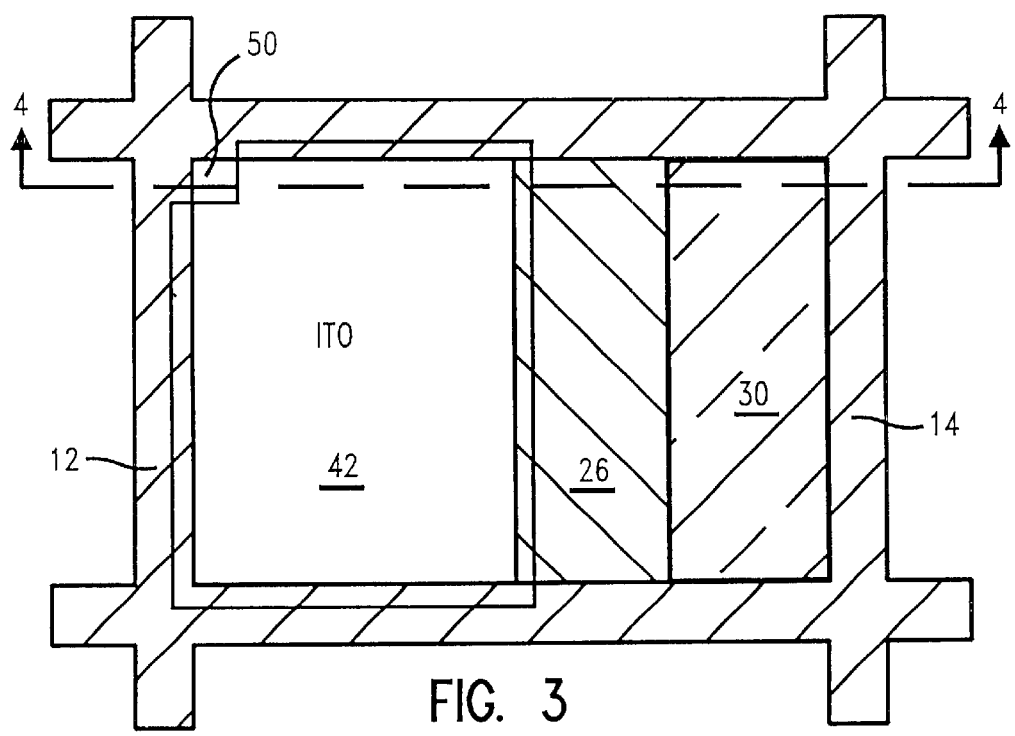
FIG. 3 provides a top plan view of an APS device constructed according to the present invention.
Figure 4:
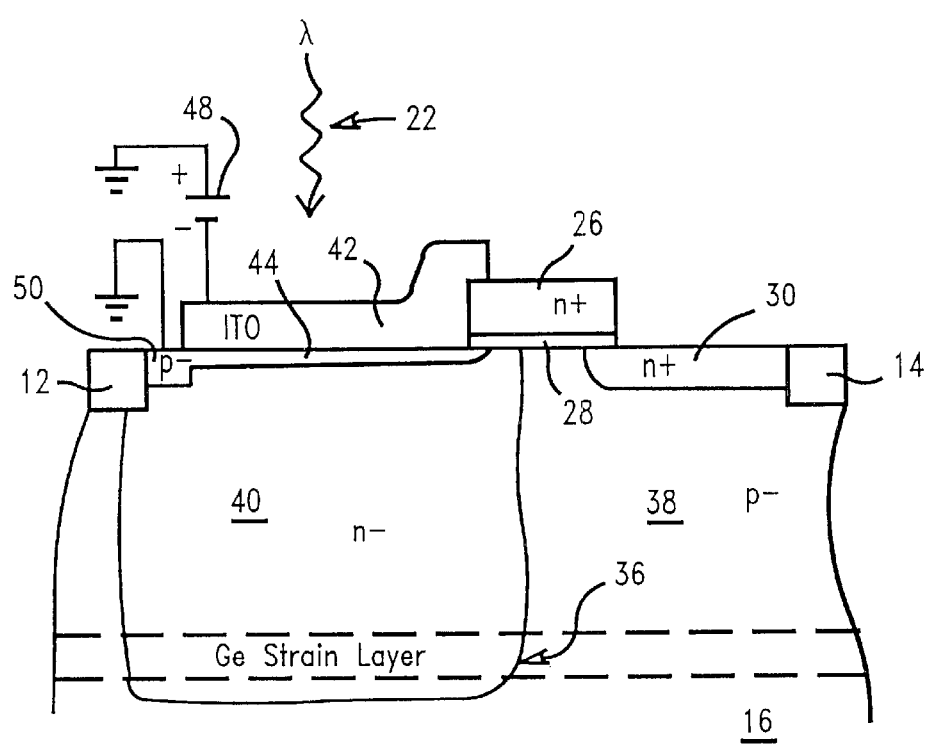
FIG. 4 provides a cross-sectional view of the APS device of the present invention taken along the line 4—4 in FIG. 3.

The benefits of the invention shown in FIGS. 3 and 4 will best be understood by first considering the construction of the prior art APS device shown in FIGS. 1 and 2. The prior art device shown there is generally indicated with reference numeral 10. This cell is separated from identical adjacent APS cells in an array of such cells which are located above, below and to either side, by a shallow trench isolation (STI) barrier. The left and right sides of the surrounding STI barrier are indicated with reference numerals 12 and 14 respectively.

The prior art APS device 10 is constructed on a substrate 16 and includes a relatively deep photosensitive region 18 of n− semiconductor material. A pinning layer 20 of p+ semiconductor material is grounded and is used to remove holes generated in the photosensitive region 18 when incoming radiation 22 of wavelength λ is absorbed.

As discussed above, short wavelength blue light radiation is absorbed easily in the p+ pinning layer 20. Typically, the thickness of the p+ layer 20, when constructed by ion implantation will be about 0.1 micrometers or greater. A layer of this thickness absorbs an undesirably high proportion of blue light before it can reach the photosensitive region 18.

Photosensitive region 18 has a depth that is typically 5 to 8 micrometers or more and is constructed in an epitaxially grown layer of p− semiconductor material of comparable thickness. The thickness of the photosensitive region in such a prior art device is determined by the necessity to absorb a significant proportion of incoming red light. Light having a wavelength of 1 micrometer or more is poorly absorbed in the n− photosensitive region 18. Unless this region is sufficiently deep, the red light radiation will pass completely through the photosensitive region 18 without being absorbed.

Incident electromagnetic radiation that is absorbed in the photosensitive region 18 creates hole-electron pairs. The holes are removed via the pinning layer 20, and by the reverse biased photodiode formed between the photosensitive region and the surrounding semiconductor material. This leaves electrons from the photon absorption to accumulate in the photosensitive region. These electrons are removed through a transfer device, comprising a polysilicon gate 26, an insulating oxide layer 28, and an adjacent semiconductor layer 30.

The transfer device is essentially an MOS transistor and when a potential source is connected to polysilicon gate 26, a channel forms below the gate in the p− semiconductor material of region 24. Current then flows between regions 18 and 30 to drain off the collected electrons produced by incoming radiation 22. Region 30 is doped as an n+ semiconductor region and polysilicon gate 26 is also n+ semiconductor material. Regions 32 and 34 on either side of the polysilicon gate are conventional insulating polysilicon-gate spacers for the transfer gate 26.

The individual APS device described and shown in plan view in FIG. 1 is repeated on all four sides, and a typical camera using such a sensor array will include circuitry to scan the transfer gates for each cell in succession to determine the brightness of the associated pixel.

Referring to FIGS. 3 and 4, the APS device of the present invention can be seen. As in the previously described prior art device, the APS device of the invention is STI isolated from adjacent cells. STI regions 12 and 14 are the left and right sides of the STI isolation trench.

The transfer device comprising regions 26, 28 and 30 is also conventional as is the substrate 16 upon which the device is formed. Lying above the substrate 16, however, is a silicon germanium strained layer 36 and a relatively thin p− epitaxially grown layer 38. The silicon germanium strained layer 36 may be epitaxially grown on top of the substrate 16 with the p− layer 38 being epitaxially grown above it. Alternatively, the layered construction shown may be formed by first growing the p− epitaxial layer 38 and then forming the strained layer by ion implantation which implants ions through the surface of layer 38 to the desired depth for layer 36.

Layer 38 is essentially identical to layer 24 (described in connection with FIGS. 1 and 2) except that it is thinner, preferably substantially thinner. Layers 38 and 36 together have a thickness which in the preferred embodiment is between 2 and 3 micrometers. This can be compared to the thickness of the layer 24 in FIGS. 1 and 2 which is typically between 5 and 8 micrometers or more.

Strained layer 36 is created by the addition of germanium, such that the bandgap of the semiconductor material in this region is narrower than elsewhere in the photosensitive region 40. This larger bandgap provides a better match to the energy of photons in red light which significantly improves the rate at which long wavelength red light is absorbed.

Consequently, the thickness of the photosensitive region 40 can be significantly less than the thickness of prior art APS devices. This allows the construction of the APS device of this invention to be more easily integrated into standard MOS processes used in the construction of support circuitry found elsewhere on the remaining portions of the substrate.

In addition to the improved absorption of long wavelength red light in the photosensitive n− region 40, the invention shown in FIGS. 3 and 4 includes a transparent conductive layer 42 positioned over a transparent insulating layer 44. The transparent conductive layer acts as a gate and is preferably formed of indium tin oxide (ITO). When connected to a negative potential source 48, the semiconductor material at the surface of photosensitive region 40 (immediately below the insulating material 44) inverts and forms a pinning layer.

As long as the negative potential source 48 remains connected, the "virtual" pinning layer formed by this inversion acts like the ion implanted pinning layer 20 shown in FIGS. 1 and 2. However, the pinning layer formed by this method has a thickness which is substantially less than the minimum thickness which can be achieved when the pinning layer is constructed by prior art methods. The virtual pinning layer will typically have a thickness of 0.05 micrometers or less. A reduction in thickness as compared to the prior art by a factor of 10 to 0.01 micrometers or less is achievable.

Further, quantum mechanical effects within the inverted region forming the pinning layer effectively broaden the bandgap in this region. Thus, the absorption of blue light photons is minimized by the short distance that the photons must travel through the virtual pinning layer, and by the mismatch between the bandgap in that region and the photon energy of blue light. The consequence is a significant increase in the number of blue light photons which arrive in the photosensitive region, and improved blue sensitivity for the device.

As can be seen in the plan view of FIG. 3, the transparent conductive layer 42 extends over most of the photosensitive region 40. However, a corner of that region, marked with reference numeral 50 is doped as a p− coupling region. The p− coupling region 50 is grounded and is electrically coupled to the virtual pinning layer. Region 50 acts to extract holes from the photosensitive region 40 via the hole inversion produced pinning layer in exactly the same way that the grounded pinning layer 20 of the prior art acts.

In an alternative embodiment to that shown in FIG. 4, the ITO transparent conductive layer 42 and the negative potential source 48 may be eliminated and replaced by an insulating layer, such as oxide having embedded negative charges. With sufficient negative charges embedded in the oxide in a conventional manner, the inversion necessary to produce the pinning layer may be accomplished without the necessity for negative potential source 48.

While the present invention has been particularly described in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of detecting electromagnetic radiation rising the steps of:
    providing a photosensitive device having:
        a substrate;
        a photosensitive region of semiconductor material disposed above the substrate, the photosensitive region having a surface for exposure to the electromagnetic radiation, and the photosensitive region producing hole-electron pairs when exposed to the electromagnetic radiation;
        a transparent insulating layer positioned over at least a portion of the surface of the photosensitive region;
        a transparent conductive layer positioned over the transparent insulating layer;
        a pinning layer for holding electrons in the photosensitive region, the pinning layer being producible by biasing the transparent conductive layer;
        a coupling region for coupling to the pinning layer; and
        a transfer device connected to the photosensitive region;
    biasing the transparent conductive layer to produce the pinning layer at the surface of the photosensitive region by inverting the semiconductor material at said surface;
    biasing the coupling region and pinning layer to prevent significant current flow through the coupling region and the pinning layer when hole-electron pairs are produced in the photosensitive region;
    exposing the photosensitive device to the electromagnetic radiation to generate hole-electron pairs in the photosensitive region;
    holding electrons in the photosensitive region during an exposure period;
    activating the transfer device to transfer electrons out of the photosensitive region; and
    measuring the current flow of electrons out of the photosensitive region to determine the electromagnetic energy received by the photosensitive region.

2. The method of claim 1 wherein the step of providing a photosensitive device comprises providing a photosensitive device having a strained layer positioned below the surface of the photosensitive region, the strained layer having a reduced bandgap for increased absorption of red light as compared to the semiconductor material elsewhere in the photosensitive region, the strained layer producing hole-electron pairs when red light is absorbed therein.

3. The method of claim 2 wherein the step of providing a photosensitive device comprises providing a photosensitive device with the strained layer formed as a silicon-germanium strained layer.

4. The method of claim 2 wherein the step of providing a photosensitive device comprises providing a photosensitive device with the strained layer formed by ion implantation.

5. The method of claim 2 wherein the step of providing a photosensitive device comprises providing a photosensitive device with the strained layer formed by epitaxy.

6. The method of claim 2 wherein the step of providing a photosensitive device comprises providing a photosensitive device with the strained layer grown on the substrate by epitaxy.

7. The method of claim 2 wherein the step of providing a photosensitive device comprises providing a photosensitive device with the strained layer located less than about 5 micrometers below the surface of the photosensitive region.

8. The method of claim 1 wherein the step of providing a photosensitive device comprises providing a photosensitive device with the transparent conductive layer formed of indium-tin-oxide.

9. The method of claim 1 wherein the step of providing a photosensitive device comprises providing a photosensitive device with the transparent conductive layer positioned over a first portion of the surface of the photosensitive region and providing a photosensitive device with the coupling region positioned over a second portion of the surface of the photosensitive region.

10. The method of claim 9 wherein the step of providing a photosensitive device comprises providing a photosensitive device with the coupling region formed by ion implantation.

11. The method of claim 1 wherein the step of biasing the coupling region and pinning layer to prevent significant current flow through the coupling region and the pinning layer when hole-electron pairs are produced in the photosensitive region comprises grounding the coupling region.

12. The method of claim 11 wherein the step of biasing the transparent conductive layer to produce the pinning layer at the surface of the photosensitive region comprises connecting the transparent conductive layer to a source of negative potential.

13. The method of claim 1 wherein the step of biasing the transparent conductive layer to produce the pinning layer at the surface of the photosensitive region comprises connecting the transparent conductive layer to a source of negative potential.

14. The method of claim 13 wherein the step of biasing the transparent conductive layer to produce the pinning layer comprises connecting the transparent conductive layer to a source of negative potential having a potential to produce the pinning layer with a depth substantially less than the depth of a pinning layer produced by ion implantation.

15. The method of claim 14 wherein the pinning layer produced has a depth of less than 0.05 micrometers.

* * * * *

UNITED STATES PATENT AND TRADEMARK OFFICE
CERTIFICATE OF CORRECTION

PATENT NO. : 6,278,102 B1
DATED : August 21, 2001
INVENTOR(S) : Terence B. Hook et al.

It is certified that error appears in the above-identified patent and that said Letters Patent is hereby corrected as shown below:

Title page,
After Item "[22] Filed: Oct. 12, 1999" insert
-- Related U.S. Application Data

[62] Division of application No. 08/915,281
filed on Aug. 20, 1997, now abandoned. --

Column 1,
After "METHOD OF DETECTING ELECTROMAGNETIC RADIATION WITH BANDGAP ENGINEERED ACTIVE PIXEL CELL DESIGN" insert -- This is a divisional of application Ser. No.
08/915,281 filed on Aug. 20, 1997, now abandoned. --

Signed and Sealed this

Nineteenth Day of March, 2002

Attest:

JAMES E. ROGAN
*Director of the United States Patent and Trademark Office*

*Attesting Officer*